United States Patent
Myers

(12) United States Patent Myers

(10) Patent No.: US 10,395,724 B1
(45) Date of Patent: Aug. 27, 2019

(54) UNREGULATED VOLTAGE STACKED MEMORY

(71) Applicant: Arm Limited, Cambridge (GB)

(72) Inventor: James Edward Myers, Bottisham (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/011,548

(22) Filed: Jun. 18, 2018

(51) Int. Cl.
| G11C 11/4091 | (2006.01) |
| G11C 11/4094 | (2006.01) |
| G11C 7/12 | (2006.01) |
| G11C 8/08 | (2006.01) |
| G11C 5/14 | (2006.01) |
| G11C 11/408 | (2006.01) |
| G11C 16/30 | (2006.01) |
| G11C 7/06 | (2006.01) |
| G11C 11/4074 | (2006.01) |

(52) U.S. Cl.
CPC ............ *G11C 11/4091* (2013.01); *G11C 5/14* (2013.01); *G11C 7/06* (2013.01); *G11C 7/12* (2013.01); *G11C 8/08* (2013.01); *G11C 11/4074* (2013.01); *G11C 11/4082* (2013.01); *G11C 11/4094* (2013.01); *G11C 16/30* (2013.01)

(58) Field of Classification Search
CPC ............ G11C 5/14; G11C 7/06; G11C 7/1048
USPC ......................................... 365/205, 207, 226
See application file for complete search history.

(56) References Cited

U.S. PATENT DOCUMENTS

| 6,097,648 A * | 8/2000 | Bessho ............... G11C 11/4097 365/203 |
| 2009/0245007 A1* | 10/2009 | Kaburlasos ............ G11C 5/143 365/226 |

OTHER PUBLICATIONS

Blutman et al; A Microcontroller with 96% Power-Conversion Efficiency using Stacked Voltage Domains; 2016 Symposium on VLSI Circuits Digest of Technical Papers; IEEE; 2016.
Ardestani et al; Managing Mismatches in Voltage Stacking with CoreUnfolding; ACM Transactions on Architecture & Code Optimization; vol. 1, No. 1, Mar. 2015.
Jain, et al; A Multi-Story Power Delivery Technique for 3D Integrated Circuits; ISLPED; Aug. 2008.

* cited by examiner

*Primary Examiner* — Han Yang
(74) *Attorney, Agent, or Firm* — Pramudji Law Group PLLC; Ari Pramudji

(57) ABSTRACT

Methods, systems, and devices supporting unregulated voltage stacked memory are described. A memory device may include one or more memory cells used to store information (e.g., in the form of a logic state) and configured into a number of memory banks. In some embodiments, the memory cells may be stacked. The memory device may also include multiple power supplies, which may be arranged in a series configuration between the memory banks. A memory control logic may be coupled in series with the power supplies and configured to equalize power across stacked memory cells when performing a read operation or a write operation to any of the plurality of stacked memory cells.

20 Claims, 7 Drawing Sheets

UNREGULATED VOLTAGE STACKED MEMORY

BACKGROUND

The following relates generally to memory systems, and more specifically to unregulated voltage stacked memory.

This section is intended to provide information relevant to understanding various technologies described herein. As the section's title implies, this is a description of related art that should in no way imply that it is prior art. Generally, related art may or may not be considered prior art. It should therefore be understood that any statement in this section should be read in this light, and not as any admission of prior art.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile.

These memory devices are widely used to store information in various electronic devices. Information is stored by programing different states of a memory device. For example, binary memory devices have two logic states, often denoted by a logic "1" or a logic "0". In other memory devices, more than two logic states may be stored. To access the stored information, a component of the electronic device may read, or sense, the stored logic state in the memory device. To store information, a component of the electronic device may write, or program, the logic state in the memory device.

Improving memory devices, may include increasing memory cell density, increasing read/write speeds, reducing voltage conversion losses due to voltage stacking across memory banks of memory devices, increasing reliability, increasing data retention, reducing power consumption, among other metrics.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

The improved techniques, methods, and related devices and integrated circuits described herein are directed to unregulated voltage stacked memory. Further, the improved techniques, methods, and related devices and integrated circuits described herein for realizing unregulated voltage stacked memory may be applicable across various platforms. An integrated circuit described herein may realize an improved unregulated voltage stacked memory by using a combination of circuit elements. The integrated circuit may offer increased read/write speeds, reduced voltage conversion losses due to voltage stacking across memory banks, increased reliability, increased data retention, reduced power consumption, among other benefits. Various implementations of unregulated voltage stacked memory will now be described with reference to FIGS. 1-6B in the paragraphs below.

Figure 1:
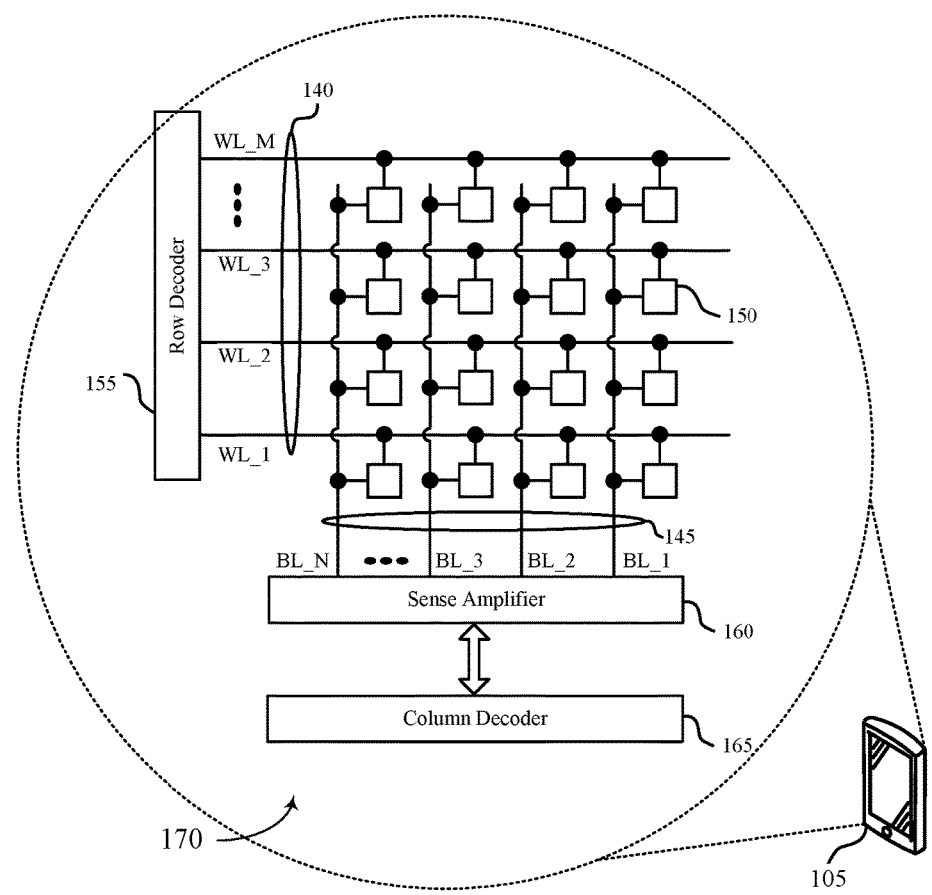
FIG. 1 illustrates an example of a system that uses unregulated voltage stacked memory in accordance with aspects of the present disclosure.

FIG. 1 illustrates an example of a system 100 that uses unregulated voltage stacked memory in accordance with aspects of the present disclosure. The system 100 may include an electronic device 105. In some examples, the electronic device 105 may include a cellular phone, a smartphone, a personal digital assistant (PDA), a wireless communication device, a handheld device, a tablet computer, a laptop computer, a cordless phone, a display device (e.g., monitors), and/or the like. The electronic device 105 may, additionally or alternatively, include or be referred to by those skilled in the art as a user equipment (UE), a user device, a smartphone, a BLUETOOTH® device, a Wi-Fi device, a mobile station, a subscriber station, a mobile unit, a subscriber unit, a wireless unit, a remote unit, a mobile device, a wireless device, a wireless communications device, a remote device, an access terminal, a mobile terminal, a wireless terminal, a remote terminal, a handset, a user agent, a mobile client, a client, and/or some other suitable terminology.

The electronic device 105 may support a memory array 170 that is directed to unregulated voltage stacked memory. Memory array 170 includes memory cells 150 that are programmable to store different states. In some examples, memory cells 150 may be part of a memory bank. Each memory cell 150 may be programmable to store two states, denoted as a logic 0 and a logic 1. In some implementations, memory cell 150 is configured to store more than two logic states. A memory cell 150 may include a capacitor to store a charge representative of the programmable states; for example, a charged and uncharged capacitor may represent two logic states, respectively.

Operations such as reading and writing may be performed on memory cells 150 by activating or selecting the appropriate word line 140 and bit line 145. Word lines 140 may also be referred to as access lines and bit lines 145 may also be referred to as bit lines. Activating or selecting a word line 140 or a bit line 145 may include applying a voltage to the respective line. Word lines 140 and bit lines 145 are made of conductive materials. For example, word lines 140 and bit lines 145 may be made of metals (such as copper, aluminum, gold, tungsten, etc.), metal alloys, other conductive materials, or the like.

According to the example of FIG. 1, each row of memory cells 150 is connected to a single word line 140, and each column of memory cells 150 is connected to a single bit line 145. By activating one word line 140 and one bit line 145 (e.g., applying a voltage to the word line 140 or bit line 145), a single memory cell 150 may be accessed at their intersection. Accessing the memory cell 150 may include reading or writing the memory cell 150. The intersection of a word line 140 and bit line 145 may be referred to as an address of a memory cell.

In some architectures, the logic storing device of a cell (e.g., a capacitor), may be electrically isolated from the bit line by a selection component. The word line 140 may be connected to and may control the selection component. For example, the selection component may be a transistor and the word line 140 may be connected to the gate of the transistor. Activating the word line 140 results in an electrical connection or closed circuit between the capacitor of a memory cell 150 and its corresponding bit line 145. The bit line may then be accessed to either read or write the memory cell 150.

Accessing memory cells 150 may be controlled through a row decoder 155 and a column decoder 165. In some examples, a row decoder 155 receives a row address from a memory controller and activates the appropriate word line 140 based on the received row address. Similarly, a column decoder 165 receives a column address from the memory controller and activates the appropriate bit line 145. For example, memory array 170 may include multiple word lines 140, labeled WL_1 through WL_M, and multiple bit lines 145, labeled BL_1 through BL_N, where M and N depend on the array size. Thus, by activating a word line 140 and a bit line 145 (e.g., WL_2 and BL_3), the memory cell 150 at their intersection may be accessed.

Upon accessing, a memory cell 150 may be read, or sensed, by a sense amplifier 160 to determine the stored state of the memory cell 150. For example, after accessing the memory cell 150, the capacitor of memory cell 150 may discharge onto its corresponding bit line 145. Discharging the capacitor may be based on biasing, or applying a voltage, to the capacitor. The discharging may induce a change in the voltage of the bit line 145, which sense amplifier 160 may compare to a reference voltage (not shown) in order to determine the stored state of the memory cell 150. For example, if bit line 145 has a higher voltage than the reference voltage, then sense amplifier 160 may determine that the stored state in memory cell 150 was a logic 1 and vice versa. Sense amplifier 160 may include various transistors or amplifiers in order to detect and amplify a difference in the signals, which may be referred to as latching. The detected logic state of memory cell 150 may then be output through column decoder 165 as an input/output.

A memory cell 150 may be set, or written, by activating the relevant word line 140 and bit line 145. As discussed above, activating a word line 140 electrically connects the corresponding row of memory cells 150 to their respective bit lines 145. By controlling the relevant bit line 145 while the word line 140 is activated, a memory cell 150 may be written—i.e., a logic value may be stored in the memory cell 150. Column decoder 165 may accept data, for example input/output, to be written to the memory cells 150. A memory cell 150 may be written by applying a voltage across the capacitor.

In some examples, a memory bank including the memory cells 150 may be stacked and also referred to herein as "voltage stacked memory". The system 100 may realize improved voltage stacking techniques for reducing voltage conversion losses due to conventional voltage stacking across memory banks. In some examples, each of the memory banks may be equal in size to realize the improved voltage stacking techniques described herein. As such, the memory array 170 of the electronic device 105 may realize an improved unregulated voltage stacked memory. The improved unregulated voltage stacked memory may offer increased read/write speeds, reduced voltage conversion losses due to conventional voltage stacking across memory banks, increased reliability, increased data retention, reduced power consumption, among other benefits.

Figure 2:
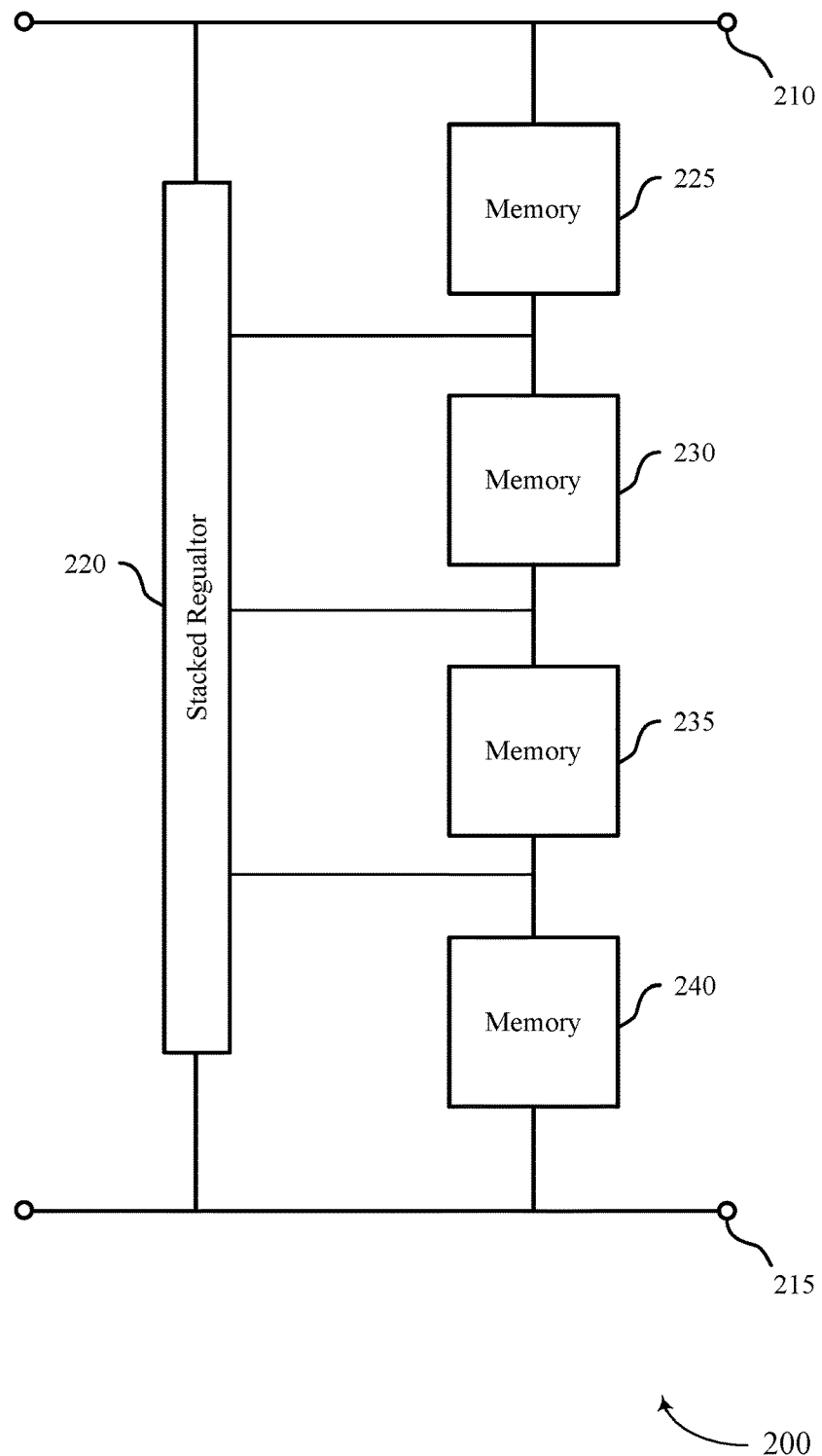
FIGS. 2 through 4 illustrate example circuit diagrams directed to unregulated voltage stacked memory in accordance with aspects of the present disclosure.

FIG. 2 illustrates an example circuit diagram 200 directed to voltage stacking in accordance with aspects of the present disclosure. The circuit diagram 200 includes an input line 210 and an output line 215, which may be examples of a word line and a bit line respectively, as described with reference to FIG. 1. In some examples, the input line 210 may provide a power-supply voltage (e.g., $V_{DD}$), while the output line 215 may be provide a negative power-supply voltage (e.g., $V_{SS}$) or be used for ground. The circuit diagram 200 may also include a stacked regulator 220, which may control an input voltage to a memory bank 225, 230, 235, and/or 240 that may be configured in a stacked arrangement. In voltage stacking techniques, multiple memory banks such as the memory banks 225, 230, 235, and/or 240 that are stacked may function as a voltage divider to divide the voltage proportionally across each of the memory banks 225, 230, 235, and/or 240. As a voltage divider, a ground of one memory bank becomes the power for the following memory bank in a stack. That is, a voltage seen across each memory bank of a memory stack may be a factor of 1/N, where N is the number of memory banks in the stack. For example, the voltage seen across each of the memory banks 225, 230, 235, and/or 240 may be ¼ the voltage of the input line 210.

Conventional voltage stacking techniques are deficient in reducing voltage conversion losses (e.g., DC-DC power conversion losses) due to voltage stacking across memory banks. The challenge in decreasing or eliminating reducing voltage conversion losses is that when power of each memory bank differs, the effective resistances in the potential divider change and layer voltages diverge from the ideal. Existing circuit solutions regulate a middle node when layer voltages diverge from the ideal—which limits current flow through a voltage regulator while still maintaining reliable voltages. To overcome these issues, the improved techniques described herein for an unregulated voltage stacked memory may provide a power management scheme which allows reduced voltage operation (to save memory energy) independent of logic voltage (allowing lower logic energy), without requiring a regulator of its own (saving system energy and silicon area).

Figure 3A:
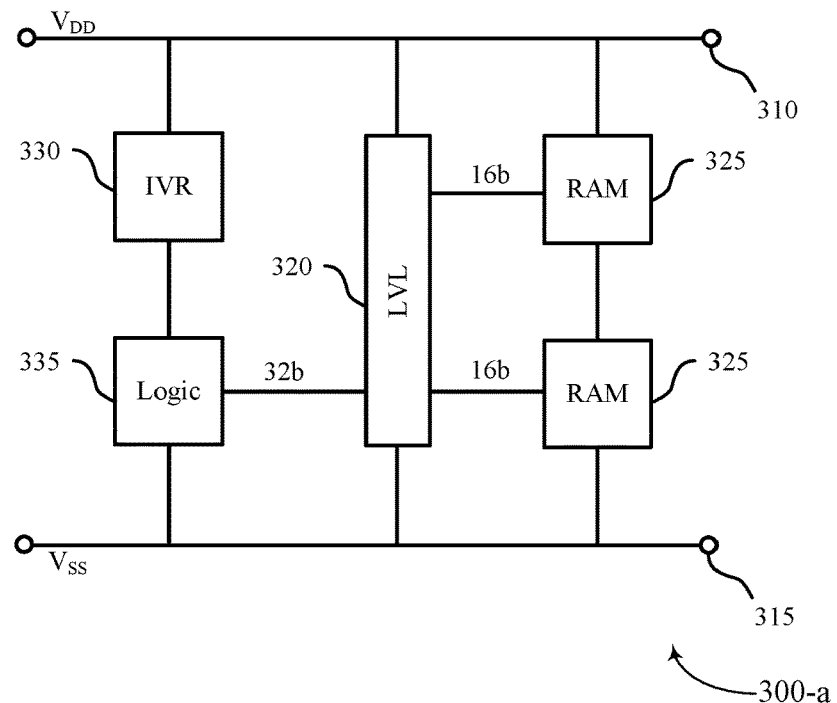
Figure 3B:
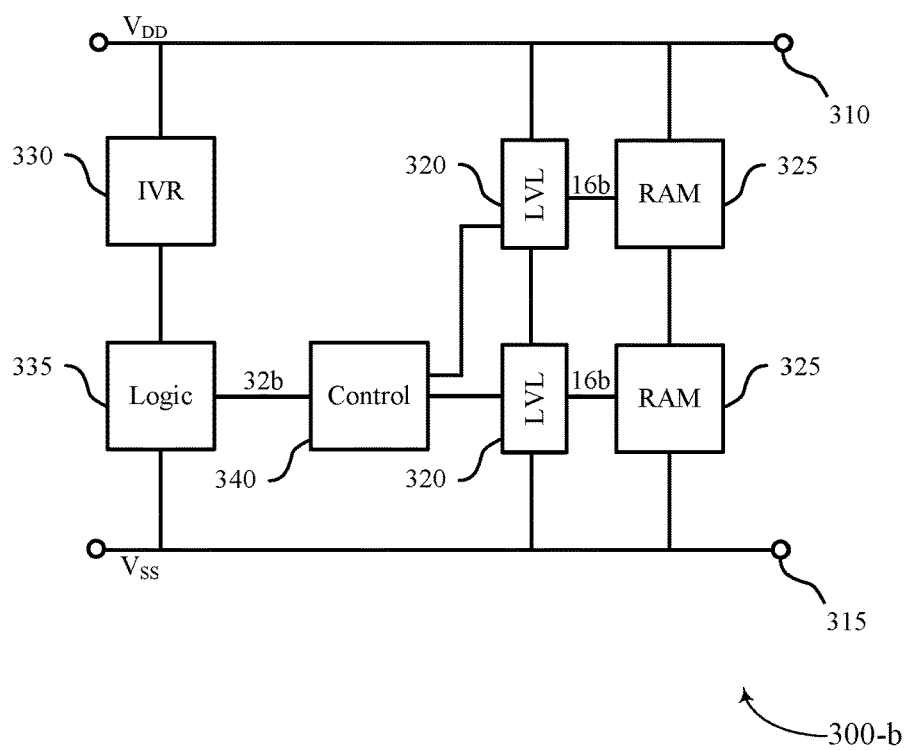

FIGS. 3A and 3B illustrate examples of circuit diagrams 300 directed to unregulated voltage stacked memory in accordance with aspects of the present disclosure. In some examples, the circuit diagrams 300 may implement aspects of the memory architecture including voltage stacking as described with reference to FIGS. 1 and 2. For example, the circuit diagrams 300 may be an example of or include components of the memory array 170 described in FIG. 1.

The circuit diagram 300 may include an input line 310 and an output line 315, which may be examples of a power supply line and a ground line respectively, as described herein. In some examples, the input line 310 may provide a positive power-supply voltage (e.g., $V_{DD}$), while the output line 315 may provide a negative power-supply voltage (e.g., $V_{SS}$) or be used for ground. For example, the input line 310 may provide a power-supply voltage of 1.2 volts (V). The circuit diagram 300 may also include at least two memory banks 325. Each memory bank 325 may be coupled to and arranged in series between the input line 310 and the output line 315. The circuit diagram 300 may support a voltage stacked memory e.g., the at least two memory banks 325, that may be equally sized (e.g., dimension, memory capacity). In some examples, the memory banks 325 may be RAM, ROM, DRAM, SDRAM, FeRAM, MRAM, RRAM, flash memory, PCM, and others.

The circuit diagram 300 may also include a voltage regulator (IVR) 330 and a logic component 335. The IVR 330 may be coupled to the logic component 335 and configured to provide access and power management operations for operations related to accessing and programming to memory banks 325. The logic component 335 may be coupled in series with the input line 310 and the output line 315 and configured to provide processing capabilities (e.g., CPU), system operations (e.g., read, write, and program commands), etc.

As shown in FIG. 3A, a level shifter 320 may be coupled to and arranged in series between the input line 310 and the output line 315. The level shifter 320 may be configured to translate signals (e.g., bits) from one logic level or voltage domain to another. For example, a 32 bit access takes 16 bit from each memory bank 325 for a bit access. This enables a cost-sensitive single-regulator system to scale logic voltage without concern for memory (which generally limits $V_{min}$) enabling better system efficiency and flexibility. For example, running the logic component 335 at 0.4V compared to 0.6V may reduce logic energy by more than 50%.

FIG. 3B shows the same circuit diagram as FIG. 3A with the addition of a control component 340 being coupled between the logic component 335 and also in electronic communication with at least two level shifters 320. Each level shifter 320 may be coupled to a corresponding memory bank 325. The control component 340 may equalize power of any stacked memory banks 325 when performing a read operation or a write operation to any of the plurality of stacked memory banks 325. The control component 340 may be coupled to and equalize power across each memory bank 325. For example, each memory bank 325 may see half the power-supply voltage from input line 310 based at least in part on the IVR 330 and the control component 340 equalizing the voltage across the memory banks 325. The power applied across the memory banks 325 may need to be equal continuously, else an inner node will diverge. In one implementation, then in standby mode, current leakage of both banks will be equal as they see the same temperature, voltage and global process—and local variation will be averaged out on all but the smallest sub-kB memory instances. For active power equalization it may be desirable to use both memory banks 325—by allocating half the input (e.g., word) to each memory bank 325.

The control component 340 may receive a read operation or a write operation from the logic component 335. For example, the control component 340 may receive a 32 bit access operation from the logic component 335. The control component 340 may then partition the 32 bit access operation equally based at least in part on a number of memory banks 325. After partitioning the 32 bit access e.g., into 16 bits, the control component 340 may forward the partitioned bits to a corresponding level shifter 320 associated with a corresponding memory bank 325. The level shifter 320 may also scale a logic voltage proportionally across each corresponding memory bank 325 when performing the read and/or write operation. The logic voltage may be proportionally scaled across each corresponding memory bank based at least in part on a voltage value of the input line 310. For example, the voltage of the input line 310 may be 1.2V, and as such, the level shifter 320 may scale the logic voltage to be 0.6V across each corresponding memory bank 325. In some implementations, an aggregator component (not shown) may be part of or coupled to the control component 340 for aggregating returned bits from each corresponding memory bank 325 based at least in part on the read and/or write operation.

The improved circuit diagrams 300 described herein may support unregulated voltage stacked memory. For example, the circuit diagram 300 described herein for realizing unregulated voltage stacked memory may be applicable across various platforms. Besides being applicable across various platforms, the circuit diagram 300 may offer increased read/write speeds, reduced voltage conversion losses due to voltage stacking across memory banks, increased reliability, increased data retention, reduced power consumption, among other benefits.

Figure 4:
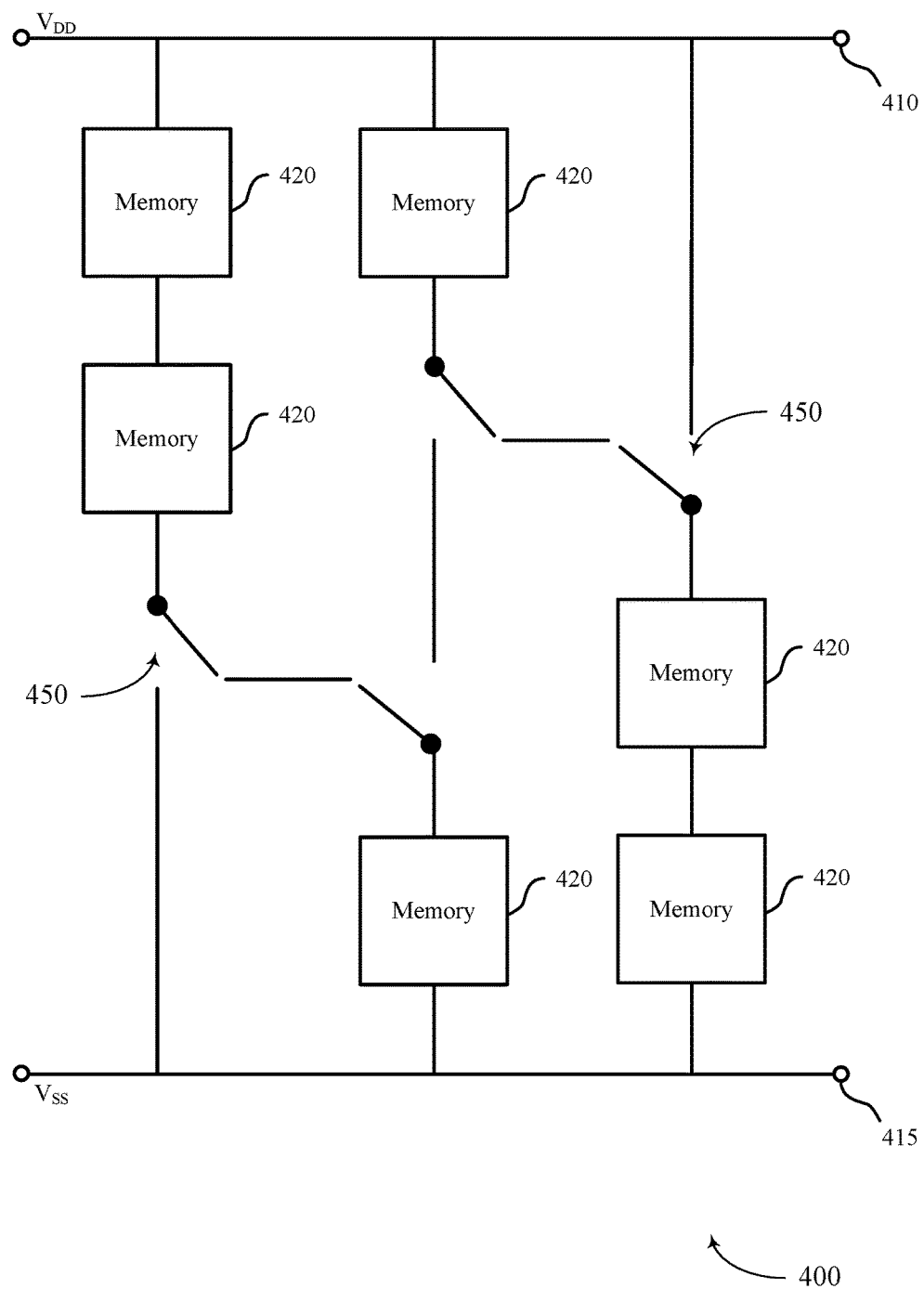

FIG. 4 illustrates an example of a circuit diagram 400 directed to unregulated voltage stacked memory in accordance with aspects of the present disclosure. In some examples, the circuit diagram 400 may implement aspects of the circuit diagram 300 as described with reference to FIG. 3. For example, the circuit diagram 400 may be an extension of the circuit diagram 300. In some examples, the circuit diagram 400 may implement aspects of the unregulated voltage stacked memory as described with reference to FIGS. 1 through 3. For example, circuit diagram 400 may be an example of or include components of the memory array as described with reference to FIG. 1.

The circuit diagram 400 may include an input line 410, an output line 415, a plurality of memory banks 420, and a plurality of power switches 450. In some examples, the plurality of memory banks 420 may be stacked and arranged in series. The circuit diagram 400 may illustrate a number of memory banks in parallel, each including at least two memory banks 420. The circuit diagram 400 may also include a number of switches 450, where each branch may include at least one switch arranged in series configuration with the memory banks 420 of each branch. In some examples, a system power controller may be configured to provide access to a corresponding memory bank based at least in part on activating or deactivating a corresponding switch 450 associated with the corresponding memory bank.

Various implementations described herein may be used to save standby power by reconfiguring the voltage stacked memory in standby (e.g., SRAM only). Retention $V_{min}$ is known to be lower than active $V_{min}$, but it can be a challenge to efficiently generate this reduced voltage on-chip. By restacking the 2-high example to be 3-high, the retention voltage may be reduced by ⅓, while the retention $V_{min}$ is unchanged. The switches 450 may be configured to implement unregulated voltage stacking. In some examples, when transitioning from standby mode to active mode, it may be desirable to break-before-make in order to avoid power shorts in the circuit diagram 400. Once switching to a memory bank is completed the corresponding memory banks 420 may steadily charge/discharge to the new target voltage—coming out of retention may require waiting until supply stabilizes. In some implementations, the number of memory banks required will have to be divisible by all supported stack heights.

Figure 5:
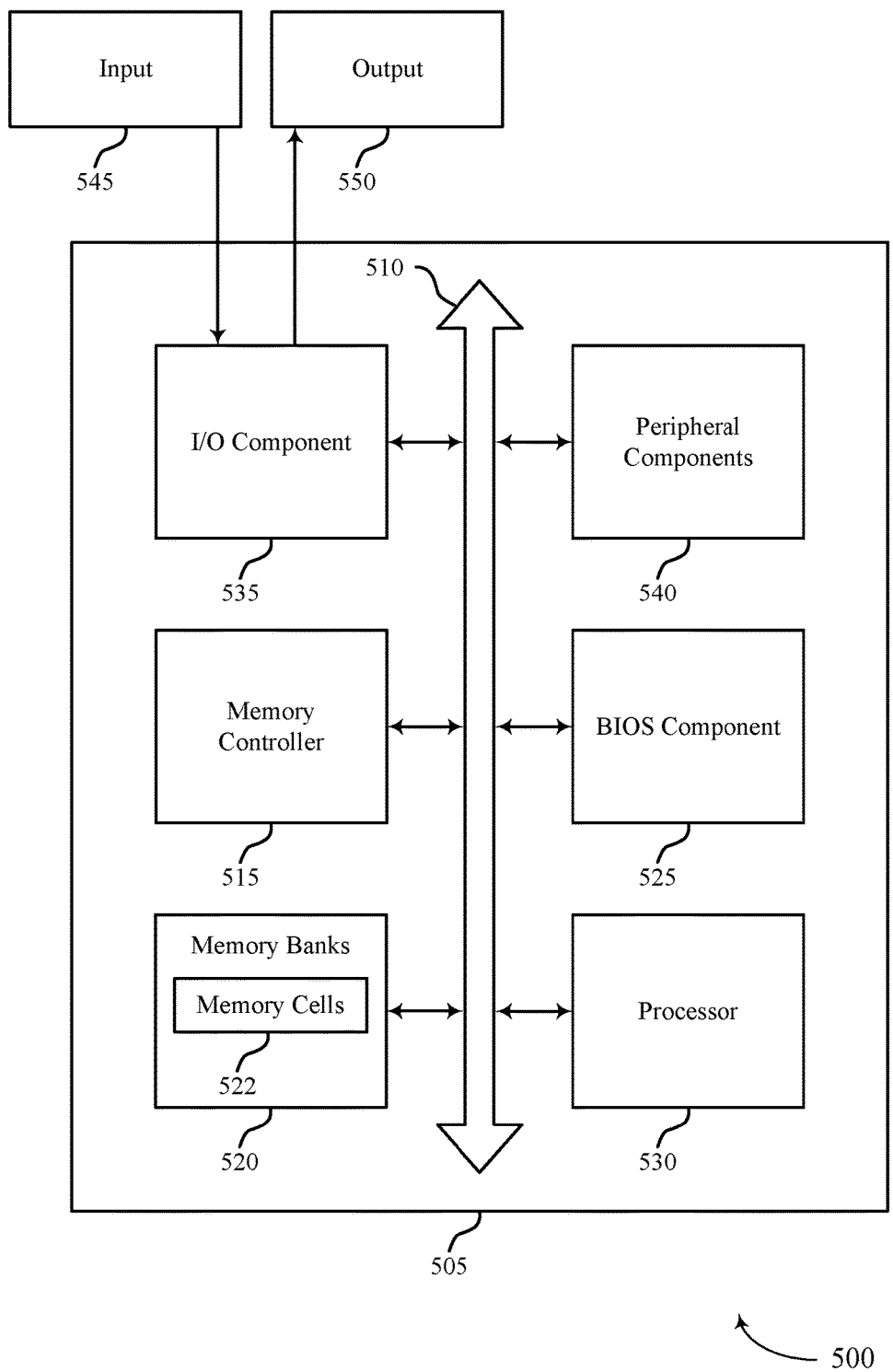
FIG. 5 illustrates an example of a block diagram of a system including an electronic device that is configured with unregulated voltage stacked memory in accordance with aspects of the present disclosure.

FIG. 5 shows a block diagram of a system 500 including an electronic device 505 that is configured with unregulated voltage stacked memory in accordance with aspects of the present disclosure. The electronic device 505 may be an example of or include components of an integrated circuit as described above, for example, with reference to FIGS. 1 through 4. The electronic device 505 may include components for bi-directional communications including components for transmitting and receiving communications, including a memory controller 515, memory banks 520 having memory cells 522, a basic input/output system (BIOS) component 525, a processor 530, an I/O component 535, and peripheral components 540. These components may be in electronic communication via one or more busses (e.g., bus 510).

The electronic device 505 may support a power management scheme for memory banks 520. Specifically, the power management scheme may provide reduced voltage operation to save memory energy that may be independent of logic voltage allowing lower logic energy, without requiring a regulator and saving the system 500 energy and device footprint (e.g., silicon area on an integrated circuit chip) for the electronic device 505.

The memory controller 515 may operate one or more memory banks 520. In some examples, the one or more memory banks 520 may be used for storing information (e.g., in the form of a logic state) as described herein. Specifically, the memory controller 515 may be configured to support accessing one or more memory banks 520 (e.g., reading or writing of a memory cell). In some implementations, the memory controller 515 may include a row decoder, column decoder, or both for accessing the one or more memory banks 520.

In some examples, the one or more memory banks 520 may define a random access memory (RAM) or read only memory (ROM). The memory banks 520 may, additionally or alternatively, define a static RAM (SRAM), a dynamic RAM (DRAM), synchronous dynamic RAM (SDRAM), ferroelectric RAM (FeRAM), magnetic RAM (MRAM), resistive RAM (RRAM), flash memory, phase change memory (PCM), or any other medium that can be used to store desired program code in the form of instructions or data structures and that can be accessed by a computer or a processor. The memory banks 520 may store computer-readable, computer-executable software including instructions that, when executed, cause the processor to perform various functions described herein.

The BIOS component 525 be a software component that includes BIOS operated as firmware, which may initialize and run various hardware components. The BIOS component 525 may also manage data flow between a processor and various other components, such as peripheral components, I/O control components, and others. The BIOS component 525 may include a program or software stored in ROM, flash memory, or any other non-volatile memory.

The processor 530 may include an intelligent hardware device, (e.g., a general-purpose processor, a digital signal processor (DSP), an image signal processor (ISP), a central processing unit (CPU), a graphics processing unit (GPU), a microcontroller, an application-specific integrated circuit (ASIC), a field-programmable gate array (FPGA), a programmable logic device, a discrete gate or transistor logic component, a discrete hardware component, or any combination thereof). In other implementations, the memory controller 515 may be integrated into processor 530. Processor 530 may be configured to execute computer-readable instructions stored in a memory to perform various functions (e.g., functions or tasks supporting dual phase detection auto focus power optimization).

The I/O component 535 may manage input and output signals for the electronic device 505. The I/O component 535 may also manage peripherals not integrated into the electronic device 505. In some implementations, the I/O component 535 may represent a physical connection or port to an external peripheral. In some implementations, the I/O component 535 may utilize an operating system such as iOS®, ANDROID®, MS-DOS®, MS-WINDOWS®, OS/2®, UNIX®, LINUX®, or another known operating system. In other implementations, the I/O component 535 may represent or interact with a modem, a keyboard, a mouse, a touchscreen, or a similar device. In some implementations, the I/O component 535 may be implemented as part of a processor. In some implementations, a user may interact with the electronic device 505 via the I/O component 535 or via hardware components controlled by the I/O component 535. The I/O component 535 may support accessing the memory banks 520, including receiving information associated with the sensed logic state of a memory cell associated with memory banks 520, or providing information associated with writing a logic state of a memory cell associated with memory banks 520.

The peripheral components 540 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 545 may represent a device or signal external to the electronic device 505 that provides input to the electronic device 505 or its components. This may include a user interface or an interface with or between other devices. In some implementations, the input 545 may be managed by the I/O component 535, and may interact with the electronic device 505 via a peripheral component 540.

The output 550 may represent a device or signal external to the electronic device 505 configured to receive output from the electronic device 505 or any of its components. Examples of the output 550 may include a display, audio speakers, a printing device, another processor or printed circuit board, or other devices. In some implementations, the output 550 may be a peripheral element that interfaces with the electronic device 505 via the peripheral component(s) 540. The output 550 may be managed by the I/O component 535.

As detailed above, the system 500 and/or one or more components of the system 500 may perform and/or be a means for performing, either alone or in combination with other elements, one or more operations for supporting unregulated voltage stacked memory.

Figure 6A:
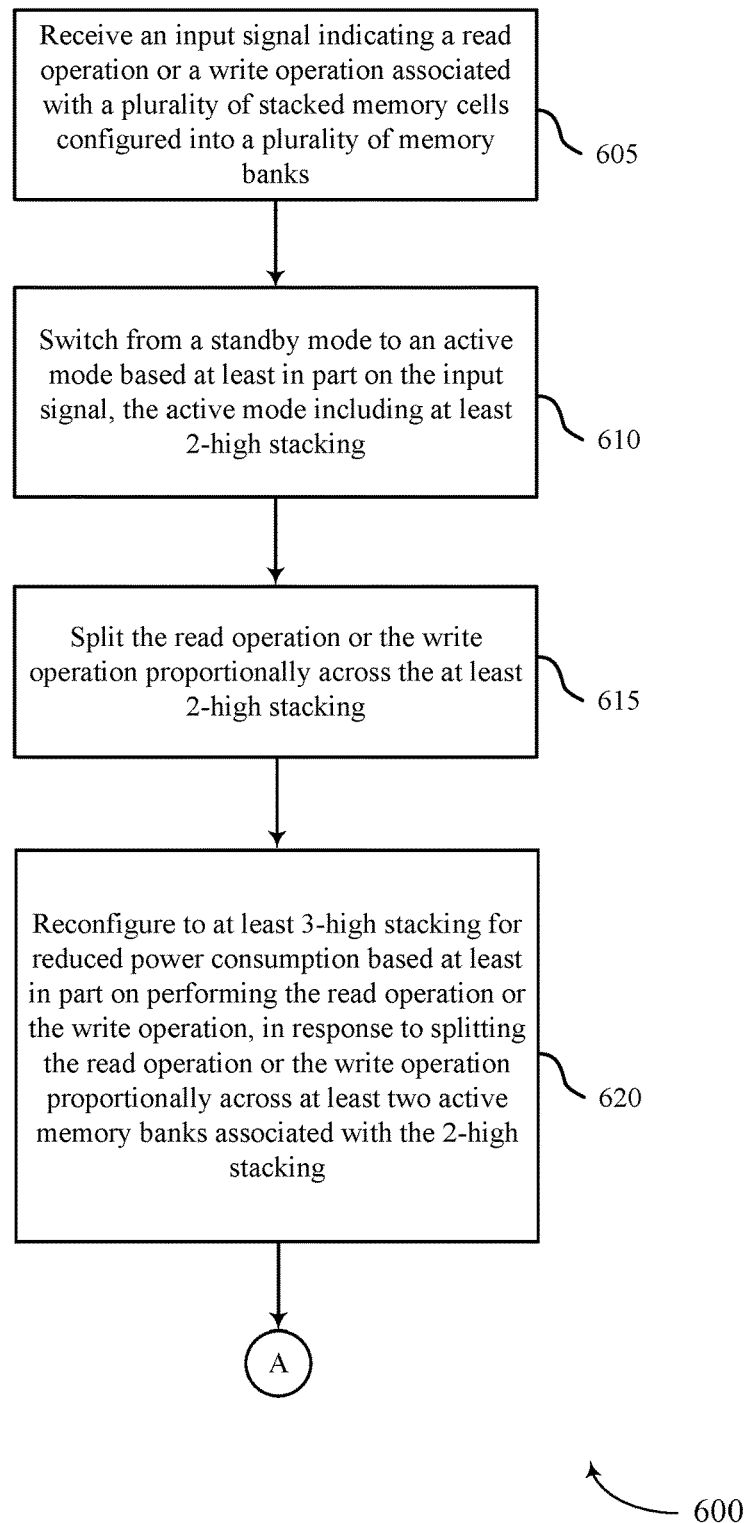
FIGS. 6A and 6B illustrate examples of a method for operating an unregulated voltage stacked memory in accordance with aspects of the present disclosure.
Figure 6B:
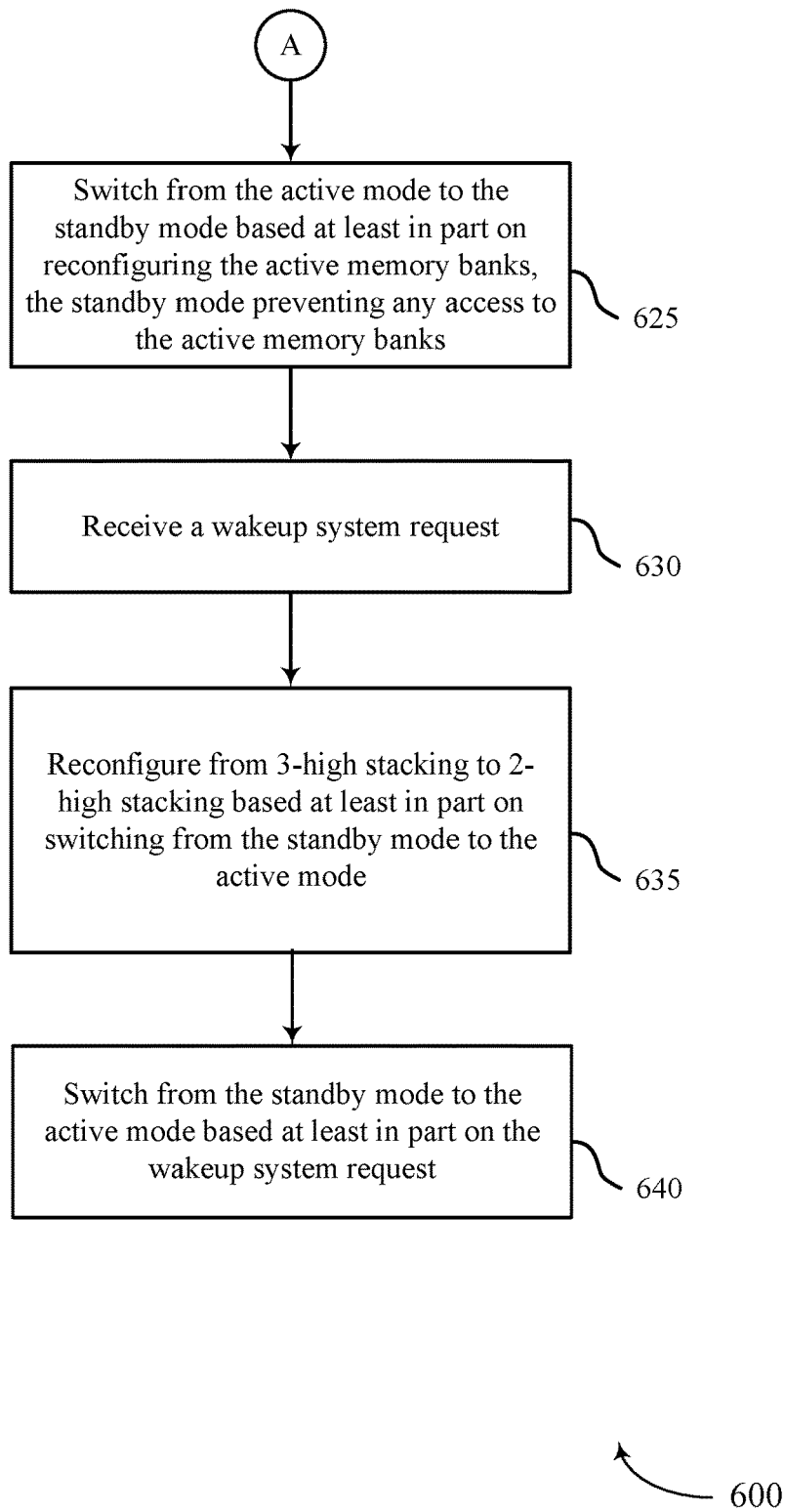

FIGS. 6A and 6B shows a flowchart illustrating a method 600 for operating an unregulated voltage stacked memory in accordance with aspects of the present disclosure. In some examples, the operations of the method 600 may include a read operation and/or a write operation of one or more stacked memory banks. The operations of the method 600 may be implemented by an electronic device or integrated circuit, or their components as described herein. For example, operations of the method 600 may be performed at least in part by an electronic device 505 as described with reference to FIG. 5. In some examples, the electronic device 505 may execute a set of instructions to control the functional elements of the electronic device 505 to perform the functions described below. Additionally or alternatively, the electronic device 505 may perform some or all of the functions described below using special-purpose hardware.

In the following description of the method 600, the operations may be performed in a different order than the exemplary order shown, or at different times. Certain operations may also be left out of the method 600, or other operations may be added to the method 600.

At 605 the electronic device 505 may receive an input signal indicating a read operation or a write operation associated with a plurality of stacked memory cells configured into a plurality of memory banks. In some examples, the plurality of stacked memory cells may be an example the memory cells 522 and the plurality of memory banks may be an examples of the memory banks 520 as described above, for example, with reference to FIG. 5. The input signal may be a voltage signal generated by a memory controller, for example, memory controller 515 as described with reference to FIG. 5. Alternatively, the voltage signal may be generated by a voltage source coupled with the memory controller 515.

At 610 the electronic device 505 may switch from a standby mode to an active mode based at least in part on the input signal. The active mode may include at least 2-high stacking.

At 615 the electronic device 505 may split the read operation or the write operation proportionally across the at least 2-high stacking.

At 620 the electronic device 505 may reconfigure to at least 3-high stacking for reduced power consumption based at least in part on performing the read operation or the write operation, in response to splitting the read operation or the write operation proportionally across at least two active memory banks associated with the 2-high stacking. The electronic device 505 (e.g., memory) may remain in the 2-high stacking active mode until a command signal occurs. For example, the electronic device 505 may remain in the 2-high stacking active mode until a power control state machine receives a standby request. After receiving the standby request, the electronic device 505 may be reconfigured to 3-high stacking and prevent access to memory.

At 625 the electronic device 505 may switch from the active mode to the standby mode based at least in part on reconfiguring the active memory banks. The standby mode prevents any access to the active memory banks. For example, the active memory banks may remain in 2-high stacking active mode until a power control state machine receives a standby request, at which point the 2-high stacking active mode may be reconfigured to 3-high stacking and prevent access to the memory banks. At 630 the electronic device 505 may receive a wakeup system request.

At 635 the electronic device 505 may reconfigure from 3-high stacking to 2-high stacking based at least in part on switching from the standby mode to the active mode. At 640 the electronic device 505 may switch from the standby mode to the active mode based at least in part on the wakeup system request.

It should be noted that the methods described above describe possible implementations, and that the operations and the steps may be rearranged or otherwise modified and that other implementations are possible. Further, aspects from two or more of the methods may be combined.

The described techniques relate to improved methods, systems, devices, and apparatuses directed to unregulated voltage stacked memory.

A memory device is described. The memory device may include a plurality of stacked memory cells configured into a plurality of memory banks, a plurality of power supplies, the plurality of memory banks arranged in series configuration between the plurality of power supplies, and a memory control logic coupled in series with the plurality of power supplies and configured to equalize power of the plurality of memory banks when performing a read operation or a write operation to any of the plurality of stacked memory cells. In some examples of the memory device described herein, equalizing power of the plurality of memory banks yields a constant voltage across each memory cell of the plurality of stacked memory cells.

The memory device described herein, in some examples, may further include a plurality of level shifters arranged in a series configuration between the plurality of power supplies, wherein each level shifter is coupled to a memory controller and a corresponding memory bank of the plurality of memory banks. In some examples of the memory device described herein, the memory controller is coupled to the memory control logic that is configured to provide processing capabilities or system operations, or both to the plurality of memory banks.

In some examples, the memory controller may be further configured to receive a read operation or a write operation, and forward a number of input bits associated with the read operation or the write operation to the memory banks. In some examples, the memory controller may be further configured to partition the number of input bits associated with the read operation or the write operation equally across each memory bank of the plurality of memory banks, and forward the partitioned number of input bits to each level shifter of the plurality. In some examples, each level shifter may be further configured to convert an input voltage level or an output voltage level.

In some examples, each level shifter may be further configured to scale a logic voltage proportionally across each corresponding memory bank of the plurality of memory banks based at least in part on performing the read operation or the write operation. In some examples, scaling the logic voltage proportionally across each corresponding memory bank of the plurality of memory banks may be further based at least in part on a voltage value of at least one of the power supplies. The memory device described herein, in some examples, may further include an aggregator coupled to each corresponding memory bank of the plurality of memory banks and configured to aggregate a number of output bits associated with the number of input bits from each corresponding memory bank of the plurality of memory banks.

The memory device described herein, in some examples, may further include a power control state machine electrically coupled between the plurality of power supplies, the power control state machine configured to receive a standby request, and reconfigure a voltage stacking associated with the plurality of memory banks based at least in part on the received standby request.

The power control state machine may be further coupled to the plurality of stacked memory cells and configured to provide access and power management operations for each corresponding memory bank of the plurality of memory banks based at least in part on the received request. The memory device described herein, in some examples, may further include a plurality of switches, each switch arranged in series configuration with the plurality of stacked memory cells of each corresponding memory bank of the plurality of memory banks. In some examples, the power control state machine is further configured to provide access to a corresponding memory bank of the plurality of memory banks based at least in part on activating or deactivating a corresponding switch associated with the corresponding memory bank.

An integrated circuit is described. The integrated circuit may include a drain voltage line, a source voltage line, a plurality of stacked memory cells configured in a series arrangement and configured into a memory bank between the drain voltage line and the source voltage line, and a memory control logic coupled in series with the drain voltage line and the source voltage line, and configured to equalize power of the plurality of stacked memory cells during a read operation or a write operation to the plurality of stacked memory cells.

The integrated circuit, in some examples, may further include a level shifter arranged in a series configuration between the drain voltage line and the source voltage, the level shifter being coupled to a memory controller and the plurality of stacked memory cells. In some examples, equalizing power of the plurality of stacked memory cells yields a constant voltage across the plurality of stacked memory cells.

The integrated circuit, in some examples, may further include a power control state machine coupled to the plurality of stacked memory cells and configured to provide access and power management operations for the memory bank of the plurality of memory banks. The integrated circuit, in some examples, may further include a switch arranged in series configuration with the plurality of stacked memory cells of the memory bank, wherein the power control state machine is further configured to provide access to the memory bank based at least in part on activating or deactivating the switch.

An apparatus is described. The apparatus may include a plurality of stacked memory cells configured in a series arrangement and configured into a memory bank between at least two voltage sources, and a memory control logic coupled in series with the at least two voltage sources, and configured to equalize power of the plurality of stacked memory cells during a read operation or a write operation to the plurality of stacked memory cells.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
a plurality of stacked memory cells configured into a plurality of memory banks;
a plurality of power supplies, wherein the plurality of memory banks is arranged in a series configuration between the plurality of power supplies; and
a memory control logic coupled in series with the plurality of power supplies and configured to equalize power of the plurality of memory banks when performing a read operation or a write operation to any of the plurality of stacked memory cells.

2. The device of claim 1, wherein equalizing power of the plurality of memory banks yields a constant voltage across each memory cell of the plurality of stacked memory cells.

3. The device of claim 1, further comprising:
a plurality of level shifters arranged in series configuration between the plurality of power supplies, wherein each level shifter is coupled to a memory controller and a corresponding memory bank of the plurality of memory banks.

4. The device of claim 3, wherein the memory controller is coupled to the memory control logic that is configured to provide processing capabilities or system operations, or both to the plurality of memory banks.

5. The device of claim 3, wherein the memory controller is further configured to:
receive a read operation or a write operation; and
forward a number of input bits associated with the read operation or the write operation to the memory banks.

6. The device of claim 5, wherein the memory controller is further configured to:
partition the number of input bits associated with the read operation or the write operation equally across each memory bank of the plurality of memory banks; and
forward the partitioned number of input bits to each level shifter of the plurality.

7. The device of claim 6, wherein each level shifter is further configured to:
convert an input voltage level or an output voltage level, or both based at least in part on the input signal.

8. The device of claim 3, wherein each level shifter is further configured to:
scale a logic voltage proportionally across each corresponding memory bank of the plurality of memory banks based at least in part on performing the read operation or the write operation.

9. The device of claim 8, wherein scaling the logic voltage proportionally across each corresponding memory bank of the plurality of memory banks is further based at least in part on a voltage value of at least one of the power supplies.

10. The device of claim 9, further comprising:
an aggregator coupled to each corresponding memory bank of the plurality of memory banks and configured to aggregate a number of output bits associated with the number of input bits from each corresponding memory bank of the plurality of memory banks.

11. The device of claim 1, further comprising:
a power control state machine electrically coupled between the plurality of power supplies, wherein the power control state machine is configured to receive a standby request and reconfigure a voltage stacking associated with the plurality of memory banks.

12. The device of claim 11, wherein the power control state machine is further coupled to the plurality of stacked memory cells and configured to provide access and power management operations for each corresponding memory bank of the plurality of memory banks based at least in part on the received standby request.

13. The device of claim 12, further comprising:
a plurality of switches, each switch arranged in a series configuration with the plurality of stacked memory cells of each corresponding memory bank of the plurality of memory banks and configured to change a stack height associated with the plurality of memory banks for a standby mode.

14. The device of claim 13, wherein the power control state machine is further configured to provide access to a corresponding memory bank of the plurality of memory banks based at least in part on activating or deactivating a corresponding switch associated with the corresponding memory bank.

15. An integrated circuit, comprising:
a drain voltage line;
a source voltage line;
a plurality of stacked memory cells configured in a series arrangement and configured into a memory bank between the drain voltage line and the source voltage line; and
a memory control logic coupled in series with the drain voltage line and the source voltage line, and configured to equalize power of the plurality of stacked memory cells during a read operation or a write operation to the plurality of stacked memory cells.

16. The integrated circuit of claim 15, further comprising:
a level shifter arranged in a series configuration between the drain voltage line and the source voltage, the level shifter being coupled to a memory controller and the plurality of stacked memory cells.

17. The integrated circuit of claim 15, wherein equalizing power of the plurality of stacked memory cells yields a constant voltage across the plurality of stacked memory cells.

18. The integrated circuit of claim 15, further comprising:
a power control state machine coupled to the plurality of stacked memory cells and configured to provide access and power management operations for the memory bank of the plurality of memory banks.

19. The integrated circuit of claim 15, further comprising:
a switch arranged in series configuration with the plurality of stacked memory cells of the memory bank, wherein the power control state machine is further configured to provide access to the memory bank based at least in part on activating or deactivating the switch.

20. An apparatus, comprising:
a plurality of stacked memory cells configured in a series arrangement and configured into a memory bank between at least two voltage sources; and
a memory control logic coupled in series with the at least two voltage sources, and configured to equalize power of the plurality of stacked memory cells during a read operation or a write operation to the plurality of stacked memory cells.

* * * * *